United States Patent [19]

Mittal et al.

[11] Patent Number: 4,551,787
[45] Date of Patent: Nov. 5, 1985

[54] APPARATUS FOR USE IN COOLING INTEGRATED CIRCUIT CHIPS

[75] Inventors: Faquir C. Mittal, Audubon; Charles R. Solis, Warminster, both of Pa.

[73] Assignee: Sperry Corporation, New York, N.Y.

[21] Appl. No.: 649,877

[22] Filed: Sep. 13, 1984

Related U.S. Application Data

[63] Continuation of Ser. No. 464,294, Feb. 7, 1983, abandoned.

[51] Int. Cl.[4] .............................................. H05K 7/20
[52] U.S. Cl. ..................................... 361/387; 361/385
[58] Field of Search ......................... 165/46, 170, 185; 174/16 HS; 361/385-387, 400, 414; 357/81

[56] References Cited

U.S. PATENT DOCUMENTS

| 3,365,620 | 1/1968 | Butler et al. | 361/385 |
| 3,405,323 | 10/1968 | Surty et al. | 361/386 |
| 4,092,697 | 5/1978 | Spaight | 361/386 |
| 4,155,402 | 5/1979 | Just | 165/46 |
| 4,156,458 | 5/1979 | Chu et al. | 165/185 |
| 4,283,754 | 8/1981 | Parks | 361/382 |
| 4,341,432 | 7/1982 | Cutchaw | 339/112 L |
| 4,361,717 | 11/1982 | Gilmore et al. | 357/81 |
| 4,402,004 | 8/1983 | Iwasaki | 357/81 |

OTHER PUBLICATIONS

Tiffany, "Integrated Circuit Package and Heat Sink", IBM Technical Disclosure Bulletin, vol. 13, No. 1, Jun. 1970, p. 58.
Gupta et al, "Conduction Cooling Module with a Variable Resistance Thermal Coupler", IBM Technical Disclosure Bulletin, vol. 21, No. 6, 11/78, p. 2434.
Doo et al, "Method of Effective Cooling a High Power Silicon Chip", IBM Technical Disclosure Bulletin, vol. 20, No. 4, 9/77, p. 1436.
Arnold et al, "Module with Internal Elements for Reducing Thermal Resistance", IBM Technical Disclosure Bulletin, vol. No. 4, 9/78, p. 1473.

Primary Examiner—A. D. Pellinen
Assistant Examiner—Gregory D. Thompson
Attorney, Agent, or Firm—James R. Bell; Thomas J. Scott; Marshall M. Truex

[57] ABSTRACT

An integrated circuit chip is cooled by being mounted on a substrate which is urged into contact with a compliant mat which includes a layer having a predetermined array of interconnected metallic pads for spreading heat flux more uniformly. The mat is connected to a plate which may be water cooled. The mat also includes additional layers which are heat conductive and electrically insulative. One of the additional layers is a film of paste.

1 Claim, 6 Drawing Figures

APPARATUS FOR USE IN COOLING INTEGRATED CIRCUIT CHIPS

This is a continuation of application Ser. No. 464,294 filed 2/7/83 now abandoned.

BACKGROUND OF THE INVENTION

1. Field of the Invention

This invention relates generally to heat exchange of an electrical article and more particularly to cooling an integrated circuit chip.

2. Description of the Prior Art

The temperature of integrated circuit chips must be kept below specified limits to ensure proper function, reliability and useful life. The trend in integrated circuit technology is toward large scale integration which results in increased functions per chip. Also, system designers are mounting chips closer together (high density packaging) to minimize propagation delays in the circuit interconnections. As a result of the foregoing, heat is not only increased for each chip but is also concentrated due to the closely mounted chips. Cooling of these chips is a problem.

Cooling of high density packaging has been achieved by placing a liquid cooled, cold plate in direct contact with a circuit package. A limitation of this is that the circuit components have various heights and shapes. A compliant interface has been used between the cold plate and the circuit components to accommodate these variations. The interface is heat conductive and electrically insulative and comprises a paste and film.

A limitation of this compliant interface is that it has high thermal resistance and does not spread the heat uniformly. Moreover, if the paste breaks down (chemically), the temperature of the components may rise to undesirable levels.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing an apparatus for use in cooling integrated circuit chips comprising a cold plate having a compliant mat thereon. The mat includes a first film of paste which is heat conductive and electrically insulative in contact with the cold plate; a second metallic film in contact with the first film; and a third film, in contact with the second film, is heat conductive and electrically insulative.

The foregoing and other aspects will become apparent from the following detailed description of the invention when considered in conjunction with the accompanying drawings. It is to be expressly understood, however, that the drawings are not intended as a definition of the invention but are for the purpose of illustration only.

DESCRIPTION OF THE PREFERRED EMBODIMENT

Figure 1:
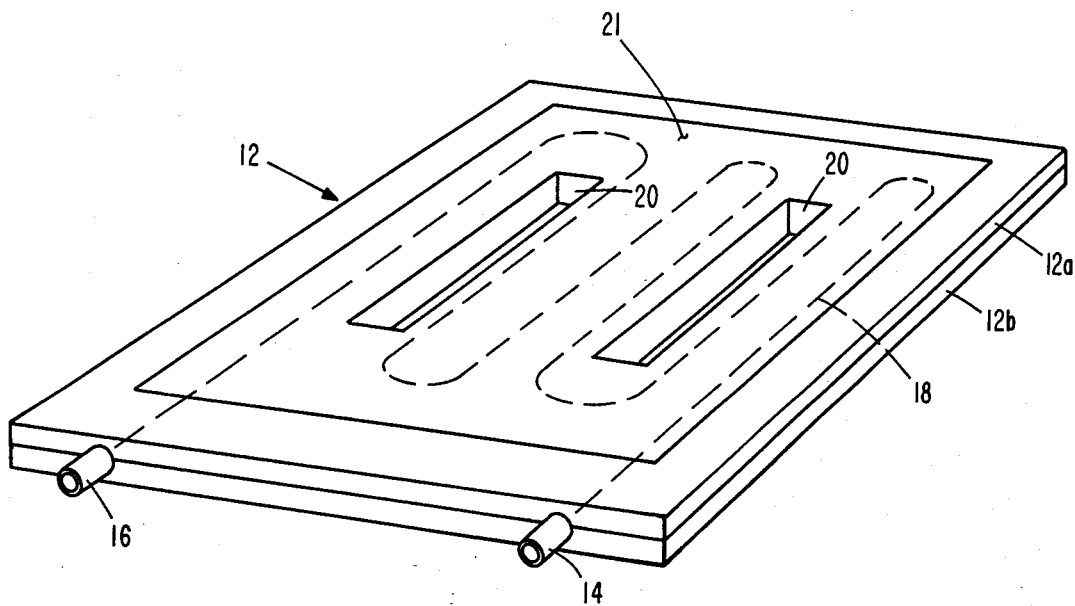
FIG. 1 is a perspective view diagrammatically illustrating an embodiment of the present invention.

Apparatus for use in cooling integrated circuit chips is generally designated 10 in FIG. 1, and includes a well-known cold plate 12 of a suitable material such as aluminum having a first portion 12a connected and sealed to a second opposed portion 12b. An inlet port 14 is connected to an outlet port 16 by an exemplary conduit 18, extending through cold plate 12 in a manner suitable for conducting a fluid, such as cold water, therethrough so as to avoid leakage within cold plate 12. A pair of openings 20 formed through cold plate 12, are provided to accommodate electrical connectors between a pair of well-known substrates mounted on opposite portions of cold plate 12. The substrates and known associated integrated circuit packages connected thereto, appear in the following discussion in greater detail.

Figure 2:
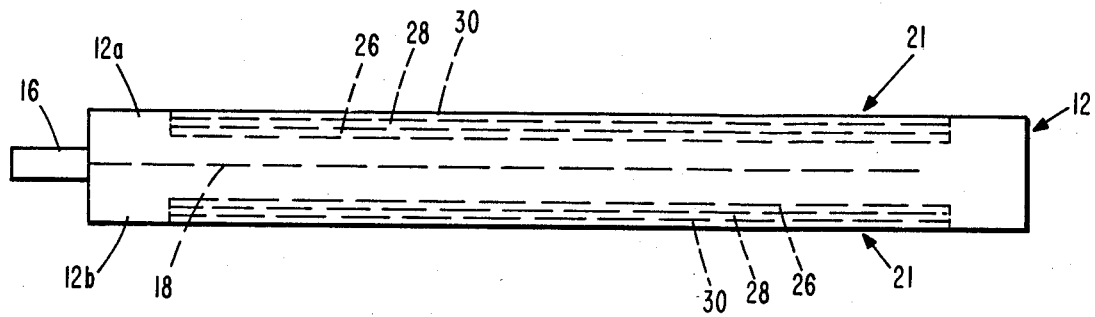
FIG. 2 is a side view illustrating an embodiment of this invention.

A compliant mat 21, FIGS. 1 and 2, is in contact with each side 12a and 12b. Each mat 21 comprises a first film of paste 26, which adheres to portion 12a, 12b. Paste 26 is a commercially available heat conductive paste. A second, metallic film 28 may be aluminum but is preferably a film of copper which adheres to paste 26 and is laminated to a third film 30 by a well-known process called MICROCLAD. Third film 30 is a commercially available plastic material and may be the product TEDLAR, a polyvinylfluoride, but is preferably the product KAPTON, a polyamide. The laminated second and third films 28, 30, respectively, are sold by Fortin Laminating Co. of Sylmar, Calif., USA. The thickness of the paste 26 is about 0.040 inches, the thickness of the copper 28 is about 0.001 inches, and the thickness of the polyamide 30 is about 0.001 inches.

Figure 5:
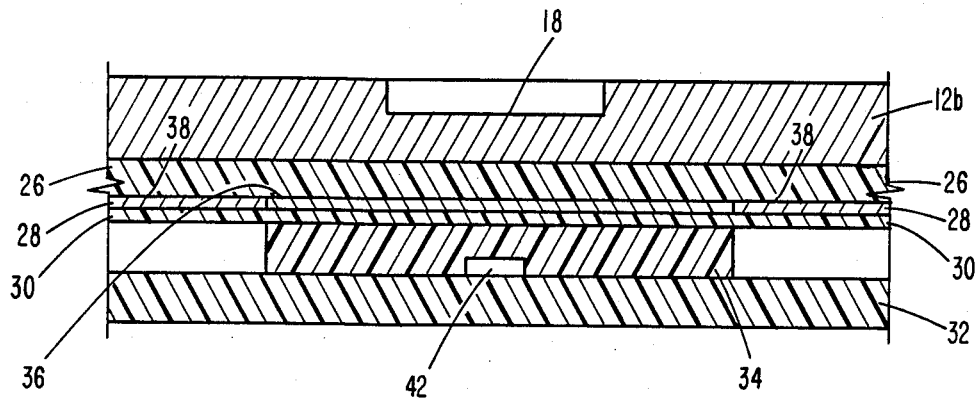
FIG. 5 is a cross-sectional side view illustrating an embodiment of the various layers of this invention and an associatd substrate.

In FIG. 5, a well-known substrate 32 is associated with portion 12b of cold plate 12. Each substrate 32 includes a plurality of commercially available integrated circuit packages 34 which may be of varying shapes and sizes. As it is well known, such substrates 32 are urged into contact with a cold plate 12 for cooling packages 34. Substrates 32 are maintained connected to plate 12 by bolts or some suitable means (not shown) and are electrically interconnected by connections (not shown) extending through openings 20.

Figure 4:
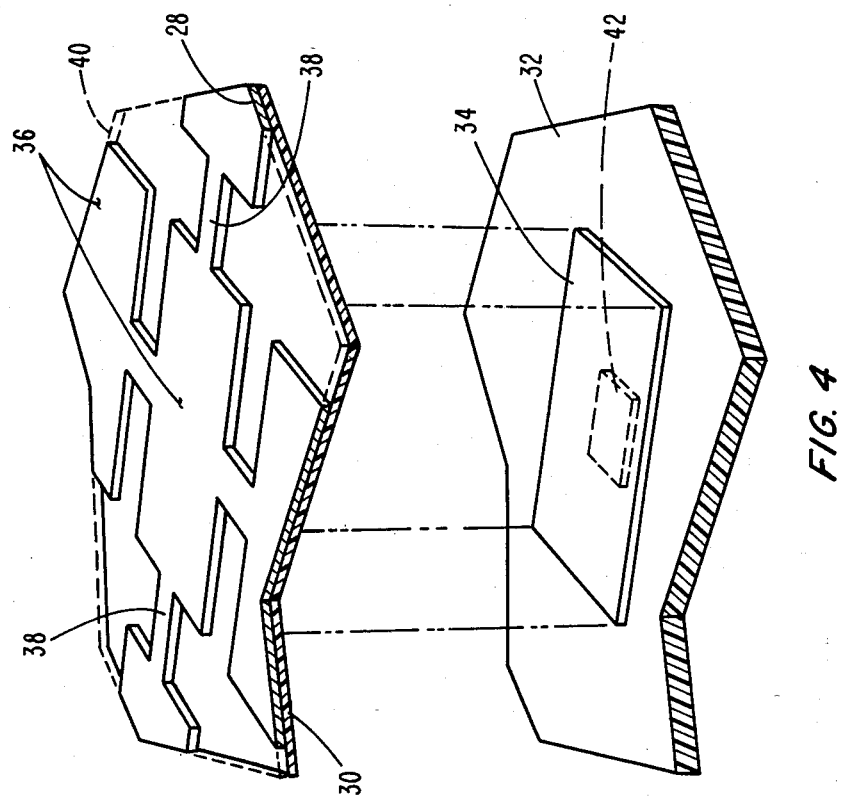
FIG. 4 is a perspective view illustrating a section of the etched film of FIG. 3 and a section of an associated substrate.
Figure 3:
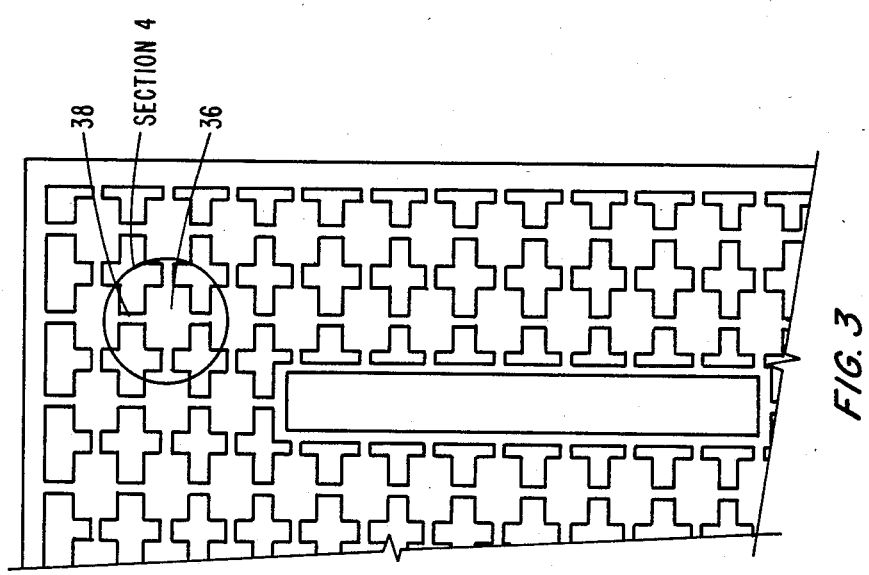
FIG. 3 is a plan view illustrating an embodiment of the etched film of this invention.

Since mat 21 is compliant, the various shaped and sized packages 34 are able to make contact with a portion of mat 21 at film 30 and therefore thermal conductivity via mat 21 is assured. In order to limit stiffness of mat 21, second metallic film 28 is etched, by a suitable process, to a predetermined array having a plurality of metallic pads 36 interconnected by metallic branches 38, see FIG. 3. The invention contemplates that the array of interconnected pads 36 may vary from that shown in the drawings. Also, it is anticipated that it may be desired to interconnect less than all the pads 36. In this manner, as illustrated in FIG. 4, metallic portions 40 of film 28 are etched away to expose film 30 thus substantially reducing the stiffness of mat 21. As a result of the etched removal of metallic portions 40, pads 36 and interconnecting arms 38 of film 28 remain to provide an array suitable for improving a spread of heat flux through mat 21.

Figure 6:
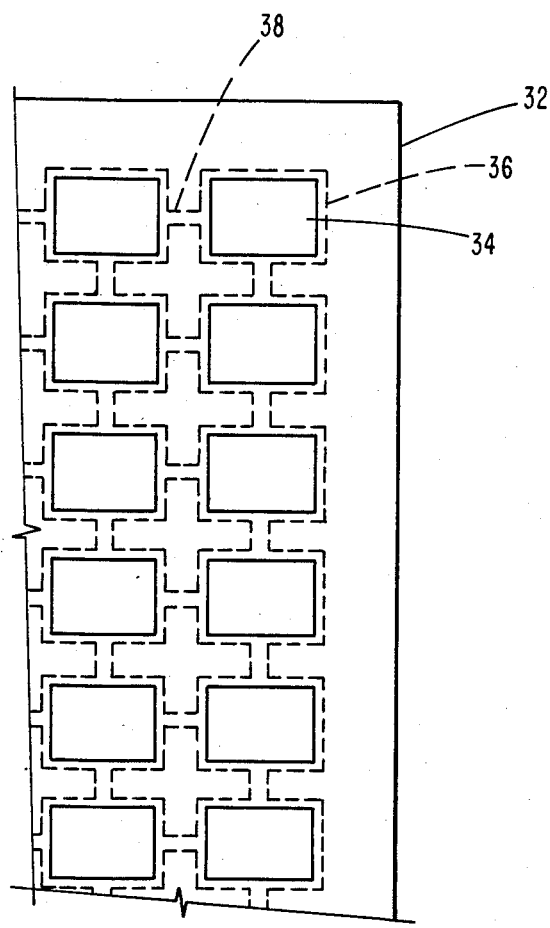
FIG. 6 is plan view illustrating an embodiment of a substrate and a predetermined array of integrated circuit packages including a superimposed corresponding array of etched film.

Packages 34 are usually formed of an insulator material such as Alumina or Berylia and include integrated circuit chips 42 imbedded therein, as is well known. These packages 34 are provided on substrate 32 in a predetermined array corresponding to the array of pads 36, see FIGS. 4, 5 and 6. In this manner, a metallic pad 36 is adjacent a respective package 34. Thus, heat generated by a chip 42 is conducted through package 34, film 30, film 28, paste 26, cold plate 12 and is eventually carried from cold plate 12 by fluid such as cold water being forced through conduit 18.

Significantly, heat may vary between each package 34, therefore, the interconnecting branches 38, aid in spreading heat between various pads 36 thus promoting uniform thermal distribution of mat 21.

In addition to removing stiffness from mat 21, etching exposes portions of film 28 thus permitting visual inspection for bubbles, or air pockets, in paste 26 which are not desired since they are insulative rather than conductive. The copper branches 38 which interconnect the copper pads 36 offer an alternate thermal path between packages 34. The alternate path concept is beneficial especially where all of the chips 42 are not dissipating similar power. Temperature distribution will be substantially unified in paste 26 and the life of paste 26 will therefore be prolonged.

The foregoing has described apparatus for cooling integrated circuit chips which are in contact with a compliant mat including a thermal paste, a metallic film for promoting the even distribution of heat flux through film 21 and another film for making contact with the integrated circuit packages.

It is anticipated that aspects of the present invention, other than those specifically defined in the appended claims, can be obtained from the foregoing description and the drawings.

Having thus described the invention, what is claimed is:

1. A cooling apparatus including integrated circuit chips comprising:
    a cold plate;
    a first film of paste in contact with said plate, said first film being heat conductive and electrically insulative;
    a second film in contact with said first film, said second film having a predetermined array of interconnected metallic pads;
    a third film in contact with said second film, said third film being heat conductive and electrically insulative, said films comprising a compliant mat;
    a substrate having a plurality of circuit packages including integrated circuit chips in a predetermined array corresponding to said array of metallic pads; and
    each of said circuit packages being in contact with said third film adjacent an associated metallic pad.

* * * * *